(12) United States Patent
Hagiwara et al.

(10) Patent No.: US 6,891,171 B1
(45) Date of Patent: May 10, 2005

(54) METHOD FOR REPAIRING A PHASE SHIFT MASK AND A FOCUSED ION BEAM APPARATUS FOR CARRYING OUT METHOD

(75) Inventors: Ryoji Hagiwara, Chiba (JP); Yoshihiro Koyama, Chiba (JP)

(73) Assignee: SII NanoTechnology Inc., Chiba (JP)

( * ) Notice: Subject to any disclaimer, the term of this patent is extended or adjusted under 35 U.S.C. 154(b) by 0 days.

(21) Appl. No.: 09/959,834
(22) PCT Filed: Apr. 19, 2000
(86) PCT No.: PCT/JP00/02555
§ 371 (c)(1), (2), (4) Date: Feb. 12, 2002
(87) PCT Pub. No.: WO00/65406
PCT Pub. Date: Nov. 2, 2000

(30) Foreign Application Priority Data
Apr. 21, 1999 (JP) ............................. 11/113907

(51) Int. Cl.[7] ............................. H01J 37/305
(52) U.S. Cl. ..................................... 250/492.2; 250/309
(58) Field of Search .......................... 250/492.2, 492.21; 437/238

(56) References Cited

U.S. PATENT DOCUMENTS 5,639,699 A * 6/1997 Nakamura et al. .......... 437/238

* cited by examiner

Primary Examiner—John R. Lee
Assistant Examiner—Phillip A Johnston
(74) Attorney, Agent, or Firm—Adams & Wilks

(57) ABSTRACT

A method is provided for repairing a phase shift mask. The phase shift mask has a substrate and a shifter containing a defect and disposed on the substrate. An ion beam is irradiated onto the defect while a region of the shifter that includes the defect is supplied with a first gas containing silicon, an oxidizing second gas, and a third gas for controlling an amount of ions from the ion beam which penetrate the region of the shifter to form a silicon thin film on the defect and thereby repair the phase shift mask.

30 Claims, 5 Drawing Sheets

METHOD FOR REPAIRING A PHASE SHIFT MASK AND A FOCUSED ION BEAM APPARATUS FOR CARRYING OUT METHOD

CROSS-REFERENCE TO RELATED APPLICATIONS

This application is a U.S. national state application of copending International Application Ser. No. PCT/JP00/02555, filed Apr. 19, 2000 claiming a priority date of Apr. 21, 1999, and published in a non-English language.

BACKGROUND OF THE INVENTION

Field of the Invention

The present invention relates to a method for correcting or repairing the occurrence of defects in a phase shift mask employed in phase-shifting techniques and to a focused ion beam apparatus appropriate for carrying out this method.

Phase shift techniques improve the resolving power of photographic exposure techniques without subjecting the exposure apparatus and resists to any particular changes. Phase shift techniques require a so-called phase shift mask. However, results for phase shift techniques cannot be obtained when defects occur in this shifter. Correction methods are therefore preferred for cases where defects occur in the shifter.

One type of shifter defect is when shifter material for part of a region for shift forming is defective. In the case of this kind of defect, it is necessary to correct the defect (specifically, to fill it in) using an appropriate correction material that satisfies conditions such as transparency with respect to the exposing light. The following related technology is provided as one method of implementing this.

Namely, a shifter defect is irradiated with an ion beam in a gas atmosphere including silicon and oxygen so that a silicon oxide film is built up on the defect and the defect is corrected. Tetraethylorthosilicate (TEOS) is widely used as this gas. TEOS is a material that is easy to use from an industrial point of view due to forming a gas easily and having superior step difference coatability for films formed, etc.

However, in the case of the aforementioned related correction method, ion beams irradiate shifter defects with only a silicon family film-forming gas being introduced into the processing chamber in the case of the aforementioned related correction methods. There are therefore many cases where carbon included in the gas or carbon present within the treatment room is taken in to the film deposited on the shifter defect. Shifter defects are therefore corrected (filled in) using a silicon oxide film with a high carbon content.

It is well known that light transmittance is lower for silicon oxide films that are high in carbon content. The aforementioned related method is therefore not preferable because the light transmittance for exposing light for the correction part of the shifter falls compared to other portions of the shifter.

As this invention sets out to resolve these kinds of problems, it is a first object of this invention to provide a phase shift mask correcting method capable of depositing a thin film with a higher light transmittance of exposing light than that of the related art as a correction thin film at shifter defects of the phase shift mask, with the thin film also having a transmittance that is more appropriate as a transmittance required of a shifter.

Further, it is a second object of this invention to provide a converging ion beam apparatus that can easily implement the correction method of the invention.

SUMMARY OF THE INVENTION

In order to achieve the first embodiment, according to the phase shift mask of this invention, there is provided a method for correcting a phase shift mask, including a step of: irradiating an ion beam onto a defect of a phase shift mask having the defect at a shifter in a mixed gas atmosphere of a first gas for silicon family thin film forming and a second gas having oxidizability so as to deposit a silicon family thin film on the defect. In the method of correcting a phase shift mask of the invention, a silicon family thin film is formed on a shifter defect mainly using the first gas. Shifter defects can therefore be corrected using this silicon family thin film. Namely, defective portions of the shifter can be filled in. Further, with the method for correct ing a phase shift mask of this invention, the second gas, which has oxidizability, is used together with the first gas. This means that carbon included in the first gas and carbon present in the treatment room for carrying out mask correction can be changed to carbon dioxide, etc. due to incurring the action of this second gas. Naturally, carbon dioxide, etc., generated in this manner is evacuated to outside of the treatment room by an evacuation apparatus which is normally connected to the treatment room and which is for evacuating the treatment room for carrying out mask correction. Therefore, according to the method for correcting a phase shift mask of this invention, a silicon family thin film with a carbon content that is much smaller compared to the case where just the first gas is used as the thin film forming gas is used can be deposited on the shifter defect.

It is also preferable for the amount of second gas supplied to be such that an amount of oxygen capable of preventing or reducing an extent to which carbon is contained in the silicon family thin film is included in the mixed gas atmosphere. This amount may be an amount of oxygen that is decided upon either by experimentation or theoretically so as to be contained in a mixed gas atmosphere in such a manner that the transmittance of the silicon family thin film deposited as the correction thin film is a kind of transmittance demanded of a shifter. In order to increase transmittance, it is preferable for there to be little carbon contained in the thin film and preferable for there to be no carbon in the thin film. Therefore, when it is necessary for the transmittance to be higher, it is one criteria for the second gas to be supplied in such a manner that an amount of oxygen in excess of an amount of oxygen stochiometrically required for forming the silicon family thin film is included within the mixed gas atmosphere of the first and second gas.

Further, with each embodiment of the method for correcting the phase shift mask of this invention, the ion beam is a beam of an appropriate ion type. Further, it is preferable if an ion beam where the ion type is gallium is used. Gallium has the benefit of a low melting point and that design of the ion source is straightforward, etc.

Further, with the method for correcting a phase shift mask of each of the embodiments, it is preferable for a third gas for reducing an extent to which ions derived from the ion beam impregnate the phase shift mask to be supplied together with the first and second gases.

Further, it is also preferable for one type of gas or two or more types of gas to be selected from halogen gas, hydrogen halide gas and for a gas of a substance including a halogen to be used as the third gas. The reason for this is as follows.

For example, it is well known that a phenomena occurs where gallium is taken in to within this glass substrate when a glass substrate is etched using an FIB apparatus employing gallium as an ion source. Making a deduction from this fact, when a thin film is deposited on a defect portion of the shifter using an ion beam, any types of the ions making up the ion beam may be taken in by the thin film. The transmittance of a thin film is then lowered when ions are taken in by the thin film. Therefore, in the preferred examples of the invention, by using a third gas together with the first and second gases, ions not required for depositing the thin film can be changed to compounds through a reaction with a halogen. For example, gallium ions are changed to compounds such as GaX2 (where X is a halogen molecule) etc. This compound is evacuated to outside of the treatment room by an evacuation apparatus which is normally connected to the treatment room and which is for evacuating the treatment room for carrying out mask correction. The fear of unnecessary ions being taken into the silicon family thin film can therefore be reduced.

A mixed gas of one type of gas or two or more types of gas selected from, for example, chlorine gas, iodine gas or bromine gas may also be used as the halogen gas for the third gas. A halogen gas subjected to hydrogenation may be provided as the hydrogen halide gas in the example shown above. Iodine gas or hydrided iodine gas may also be used. This is because the extent of damage to the glass (blanks for phase shift blanks) is minimal when iodine is included. The transmittance and phase fluctuation of the blanks therefore does not occur.

It is preferable for the amount of third gas supplied to be the minimum amount necessary to prevent or reduce the extent to which ions of the ion beam are contained in the thin film deposited on the defect of the shifter. However, when the extent of the vacuum within the treatment room deteriorates (for example, when it becomes worse than $5 \times 10^{-5}$ Torr), the ion beam itself can no longer propagate. The amount of third gas supplied can therefore be decided taking into consideration the extent of the vacuum of the treatment room for the whole of the first to third gases. Specifically, this is decided either by experimentation or theoretically.

Further, in order to achieve the second object of this invention, an FIB apparatus of this invention comprises a treatment room capable of forming a vacuum atmosphere, capable of enabling the propagation of an ion beam, and capable of housing a phase shift mask having a shifter with a defect; an ion beam supplying unit for emitting the ion beam; an evacuation unit for evacuating the treatment room; a gas supplying unit for supplying at least a silicon family thin film forming first gas and a second gas having oxidizability to within the treatment room; a control unit for controlling the treatment room, ion beam supply unit, evacuation unit and gas supply unit in such a manner as to at least execute processing to deposit a silicon family thin film on the defect by irradiating the defect of the shifter with the ion beam with the first and second gases introduced to within the treatment room after evacuating the treatment room.

According to the FIB apparatus of this invention, a method of correcting a phase shift mask of this application can be implemented in a straightforward manner.

DETAILED DESCRIPTION OF THE PREFERRED EMBODIMENTS

The following is a description, with reference to the drawings, of embodiments of a phase shift mask correction method and FIB apparatus according to the present invention. Each structural component is shown in an abbreviated manner in each of the drawings used in the following description to an extent that enables this invention to be understood. The same structural components in each drawing are given the same numerals in order to omit duplicity from this description.

Figure 1:
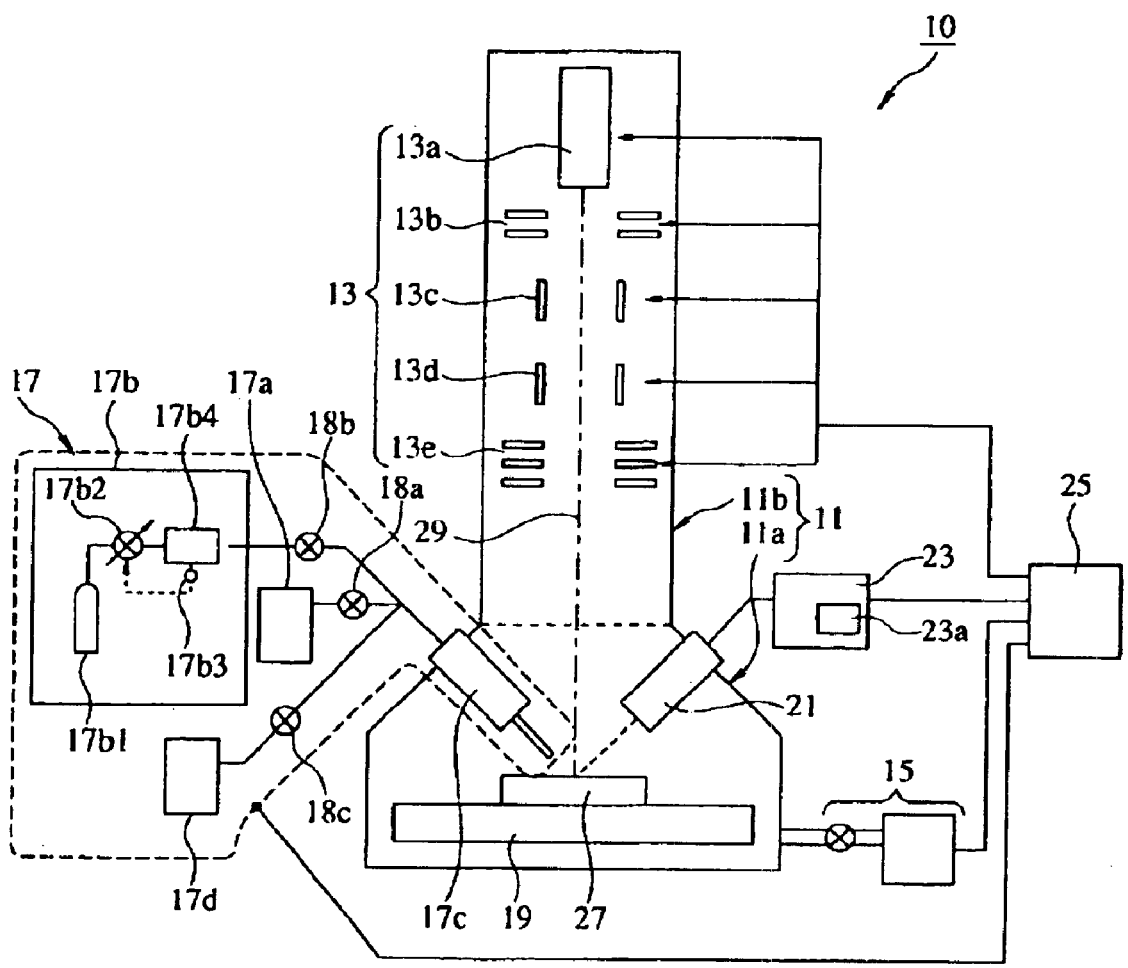
FIG. 1 is a view illustrating an FIB apparatus of an embodiment.

FIG. 1 is a outline structural view of the apparatus for illustrating a focused ion beam (FIB) apparatus 10 suited to the embodiments of the phase shift mask correction method of this invention.

This FIB apparatus 10 is provided with a treatment room 11, ion beam supply unit 13, evacuation unit 15, gas supplying unit 17, sample stage 19, secondary charged particle detector 21, image forming device 23 and control unit 25.

A situation is shown in FIG. 1 where a sample 27, i.e. a phase shift mask 27 having a shifter defect, is placed on the sample stage 19.

The treatment room 11 is a room capable of internally forming a vacuum atmosphere, propagating an ion beam 29, and of allowing the sample 27 to be inputted and removed. The treatment room 11 for this embodiment has a first chamber 11a for housing the sample stage 19, etc., and a second chamber 11b cylindrical in shape, for housing the ion beam supply unit 13 etc.

The ion beam supply unit 13 supplies the ion beam 29 to the sample 27 with the desired beam diameter. The ion beam 29 can irradiate the sample 27 at arbitrary positions and the ion beam 29 can scan arbitrary regions of the sample 27. In order to achieve this, the ion beam supply unit 13 of the example structure is provided with an ion source 13a, a lead out electrode 13b, a blanking electrode 13c, a scanning electrode 13d and an object lens 13e, which are positioned within the second chamber 11b in this order, as is well known.

The ion source 13a generates ions for irradiating the sample 27. This ion source 13a is provided in the vicinity of the top part of the second chamber 11b of the treatment room 11. This ion source 13a may be an ion source generating one type of ions or an ion source generating two types of ions or more, with one arbitrary type of ion then being selected for extraction. Gallium, gold, silicon or tin ions may be provided as ions most appropriate for correcting defects in phase shift mask shifters. Of these, gallium ions are the easiest for designing an ion source for reasons such as the melting point of the gallium itself being low. Silicon ions are also desirable. The reason for this is that one of the major applications for FIB devices is semiconductor devices. This is because it is very difficult for silicon ions to become impurities for semiconductor substrates and for silicon substrates in particular.

The lead out electrode 13b is for leading out ions generated by the ion source 13a towards the side of the sample 27.

The blanking electrode 13c is an electrode used when halting irradiation of the ion beam 29 to the sample 27.

Specifically, the ion beam 29 going towards the sample 27 can also go in a direction different to the direction towards the sample 27 and as a result, the irradiation of the ion beam 29 towards the sample 27 is stopped.

The scanning electrode 13d causes the ion beam 29 to scan the sample 27. The object lens 13e focuses the ion beam 29.

Further, the evacuation unit 15 is for putting the treatment room 11 into the desired vacuum state and is constructed from an arbitrary appropriate vacuum pump. With the example structure shown in FIG. 1, this evacuation unit 15 is connected to the first chamber 11a.

The gas supplying unit 17 includes first gas supply means 17a and second gas supply means 17b. The gas supplying unit 17 includes a gas gun 17c for blowing first and second gases into a prescribed limited region (for example, a region limited to that including the shifter defects). In the example structure in FIG. 1, the gas gun 17c is provided in the first chamber 11a and is located facing the sample 27. An example is shown for the example structure in FIG. 1 where there is a single gas gun but the invention is by no means limited to this example. For example, a gas gun may be provided for each of first to third gas supply means. Further, the gas supplying unit 17 should preferably adopt a structure (described in detail later) including a third gas supplying means 17d for supplying halogen gas as a third gas. In the example structure shown in FIG. 1, the gas supplying unit 17 adopts a structure including third gas supply means 17d.

The first gas supply means 17a supplies gas for forming silicon family thin films. The first gas is sent to the gas gun 17c via a valve 18a. Principally, a silicon family thin film is deposited on the defect of the phase shift mask shifter by the first gas. A detailed example of the first gas is described in the following.

The second gas supply means 17b supplies a second gas having oxidizability. After passing through a valve 18b, the second gas is mixed once with the first gas and then sent to the gas gun 17c. The second gas is employed to prevent or reduce the extent to which undesirable atoms are included with the film deposited at the shifter defect portion. Specifically, the inclusion of carbon in the deposited film is prevented or reduced by oxidizing carbon included in the first gas to produce carbon dioxide etc., and evacuating this to outside of the treatment room 11 using the evacuation unit 15. A detailed example of the second gas and control of the supply amount is described in the following.

The reason for using the third gas supply means 17d is to prevent ions constituting the ion beam from being included within the film deposited on the defective portions of the shifter. Specifically, the inclusion of ions in the deposited film is prevented by changing the ions into halides and evacuating the halides to outside of the treatment room 11 using the evacuation unit 15. After passing through a valve 18c, the third gas is mixed with the first and second gases and then sent to the gas gun 17c.

The bodies of the first to third gas supply means 17a to 17d adopt arbitrary structures appropriate for the type of gas being used. Namely, the gas source for the gas being used is also gaseous. Gas supply means therefore adopt structures provided with as gas cylinder 17b1 that is filled up with gas, a control valve 17b2 for controlling the amount of flow, a vacuum gauge 177b3, and a buffer 17b4, etc., as shown, for example, for the second gas supply means 17b in FIG. 1. Further, it is also possible to provide the gas supply means with means (not shown) for heating the gas source or means for controlling the amount of flow etc., when the gas source for the gas used is a liquid or solid that requires heating. The sample stage 19 is a stage on which the sample 27 is mounted and which can move the sample 27 to arbitrary positions in three directions of x, y and z. The z direction is a direction along a line linking the ion source 13a and the sample stage 19 and the x and y directions are directions in a plane perpendicular to this z direction and orthogonal to the z direction, respectively. The xy plane is the plane on which the sample 27 is mounted.

The secondary charged particle detector 21 receives secondary electrons or secondary ions outputted from the sample 27 when the sample 27 is irradiated with an ion beam 29 and converts this intensity to a current for outputting to image forming apparatus 23 (for example, a Scanning Ion Microscope (SIM)). The secondary charged particle detector 21 is provided within the first chamber 11a at a position most suited to receiving secondary charged particles. The image forming apparatus 23 forms an image in response to the secondary charged particle discharge performance at each point of the sample 27 that is irradiated with the ion beam and this image is displayed at the display unit 23a. The FIB apparatus 10 can therefore be utilized as a SIM. This function can be utilized, for example, in the case of monitoring corrected portions for after correction of the shifter defects.

The structures of the secondary charged particle detector 21 and the image forming apparatus 23 themselves are well known and a detailed description thereof is therefore omitted here.

The control unit 25 controls the treatment room 11, ion beam supplying unit 13, evacuation unit 15, sample stage 19, secondary charged particle detector 21 and image forming apparatus 23 so as to operate in prescribed manners. The control unit 25 can, for example, be constructed using apparatus including a computer, a sensor provided at an appropriate position, and an electronic circuit. In particular, the control unit 25 in this case controls the treatment room 11, ion beam supplying unit 13, evacuation unit 15 and gas supplying unit 17 in such a manner that, after the inside of the treatment room 11 is evacuated to a prescribed vacuum, at least processing to deposit a silicon family thin film on the defective portion is implemented by irradiating the defective portion of the shifter of the phase shift mask 27 with the ion beam 29 with the first and second gases introduced to within the treatment room 11. This kind of control is investigated, for example, experimentally in advance to get appropriate ranges for, for example, a degree of vacuum, ion beam intensity, and flow quantities for the first to third gases, etc. The control unit then monitors these parameters on a vacuum gauge and flowmeter, etc., and control is then exerted so that operations obey a predecided order.

Next, a description is given of embodiments for several phase shift mask correction or repair methods of this invention. Several situations where shifter defects are corrected using the FIB apparatus 10 described referring to FIG. 1 are now described. This description is set forth with reference to FIG. 2 to FIG. 4.

FIG. 2 is a view illustrating a first embodiment of a correction method. At a phase shift mask 27A where a shifter 27b is provided separately on a substrate 27a for phase shift mask use, an example is shown of correcting the phase shift mask 27A where a defect (defective portion) 27c occurs at part of the shifter 27b. The views are side views (the same also applies for FIG. 3 to FIG. 5 in the following) paying attention to displaying the vicinity of the sample stage 27 and gas gun 17c of the FIB apparatus 10.

First, the phase shift mask 27A is placed on the sample stage 19. Evacuation then takes place via the evacuation unit 15 so as to bring about a prescribed degree of vacuum within the treatment room 11. The invention is not limited in this respect, but evacuation to give a high vacuum state of within $10^{-5}$ Torr is preferable.

Next, the first and second gases are supplied (blown) from the gas supplying unit 17 to a region including the defect 27c via the gas gun 17c. At this time, the amount of second gas supplied is an amount of oxygen capable of preventing or reducing the extent to which carbon is contained within the silicon family thin film deposited on the defect 27c of the shifter 27c. An amount is therefore supplied in such a manner that an amount of oxygen capable of making the transmittance of the thin film the transmittance that is demanded of shifters is included within the treatment room 11.

This kind of amount can be realized by the control unit 25 controlling the flow ratio of the first and second gases. Further, this kind of flow ratio can be decided in advance either experimentally or theoretically and a flow amount controller for the first and second gas supply means 17a and 17b can be controlled by the control unit 25 based on the flow ratio.

For example, when tetraethylorthosilicate (TEOS) gas is used as the first gas, and oxygen is used as the second gas, then if the TEOS flow amount is taken to be 1, then an oxygen flow amount of 0.001 or more is preferable (this is 10 or more in cases where stoichiometry is to be fulfilled).

It is preferable for the flow amount to be a flow amount within this range that is capable of realizing the transmittance demanded of a shifter. This is, of course, only one example.

A gas including both or one of oxygen atoms and nitrogen atoms, together with silicon atoms can be used as the first gas. Further, a gas (silane, etc.) that positively does not include oxygen atoms and nitrogen atoms but includes silicon atoms may also be used. However, the former gas, i.e. a gas including both or one of oxygen atoms and nitrogen atoms, together with silicon atoms, is preferred as the first gas. This takes into consideration ease of forming a silicon family thin film using the FIB apparatus.

When a gas including silicon atoms and oxygen atoms is used as the first gas, an oxidized silicon family thin film can be deposited on defective portions of the shifter. Further, when a gas including silicon atoms and nitrogen atoms is used as the first gas, a nitrided silicon family thin film can be deposited on defective portions of the shifter. Still further, when a gas including silicon atoms, oxygen atoms and nitrogen atoms is used as the first gas, an oxided/nitrided silicon family thin film can be deposited on defective portions of the shifter.

One type of gas or a mixed gas of two or more types of gases selected from the gas compound shown in equation (1) in the following can be produced as a gas containing silicon atoms and oxygen atoms.

$$(R\text{—}O)_4 Si \qquad (1).$$

Specifically, one type of gas or two or more types of gas selected from, for example, tetraethylorthosilicate (TEOS) gas, tetramethyorthosilicate (TMOS) gas, and tetrapolopolysilane (TPOS), can be used. TEOS is the most preferred of these gases. This is because TEOS is a material that is easy to use from an industrial point of view due to forming a gas easily and having superior step difference coatability for films formed, etc.

Further, one type of gas or a mixed gas of two or more types of gases selected from oxygen, ozone, water vapor and $NO_x$ (where x shows the combination ratio of the nitrogen and oxygen) can be used as the second gas. It is also possible to select one type of gas or two or more types of gas from oxygen, ozone and water vapor as the second gas. These second gases are easy to procure and manage, and are also preferable with regards to eliminating carbon. Oxygen or water vapor are still more preferable as the second gas.

Figure 2A:
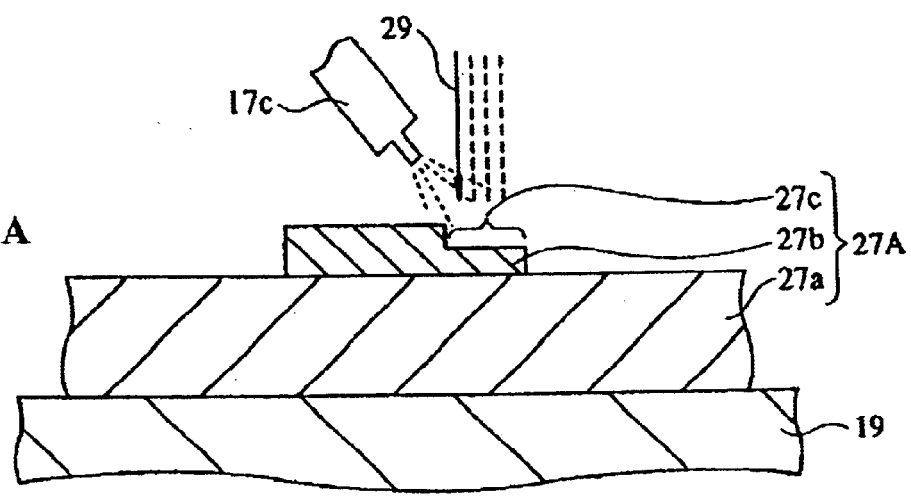
FIG. 2 is a view illustrating a first embodiment of a phase shift mask correction method.
Figure 2B:
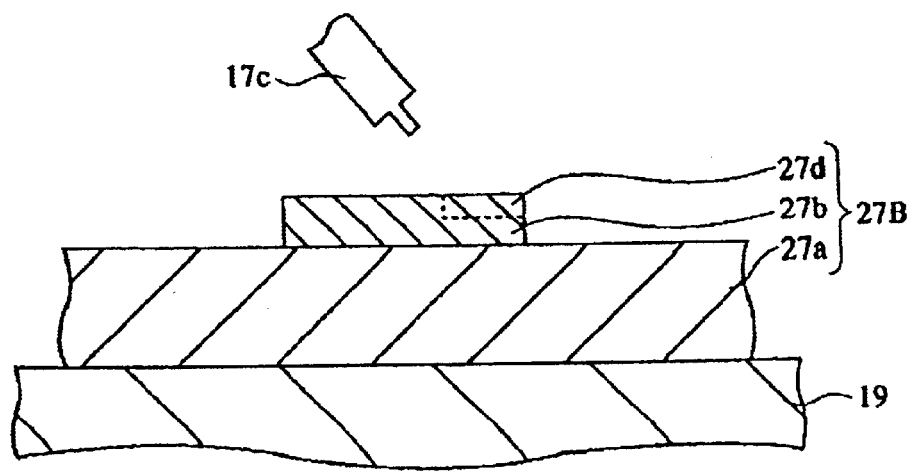

A prescribed region including the defect 27c is scanned by the ion beam 29 (FIG. 2(A)) with the first and second gases supplied in the above manner. The result of this scanning is that a silicon family thin film 27d is formed on the defect 27c (FIG. 2(B)). The thin film 27d is of a thickness required to shift the transmitted light by the required phase angle. This film thickness can be managed using, for example, the ion beam scanning frequency, etc. The relationship between the ion beam scanning frequency and the film thickness of the thin film is therefore obtained in advance by experimentation. This data is then stored in memory (not shown) of the control unit 25 and the film thickness can be controlled based on this data. A phase shift mask 27B with the shift defect 27c corrected can therefore be obtained using the above series of processes.

By varying the flow amount of the second gas with respect to the first gas it is possible to change the refractive index of the silicon family thin film 27d. It can then be considered possible to adjust the phase or exposing light to a certain extent at the silicon family thin film 27d using this flow ratio.

FIG. 3 is a view illustrating a second embodiment of a correction method. The thickness of a portion of the substrate 27a of the phase shift mask is made thin. At this portion itself, at the phase shift mask 27C constituted by the shifter 27e, an example is shown where the phase shift mask 27C with a defect (defective portion) 27f occurring at part of the shifter 27e is corrected.

Figure 3A:
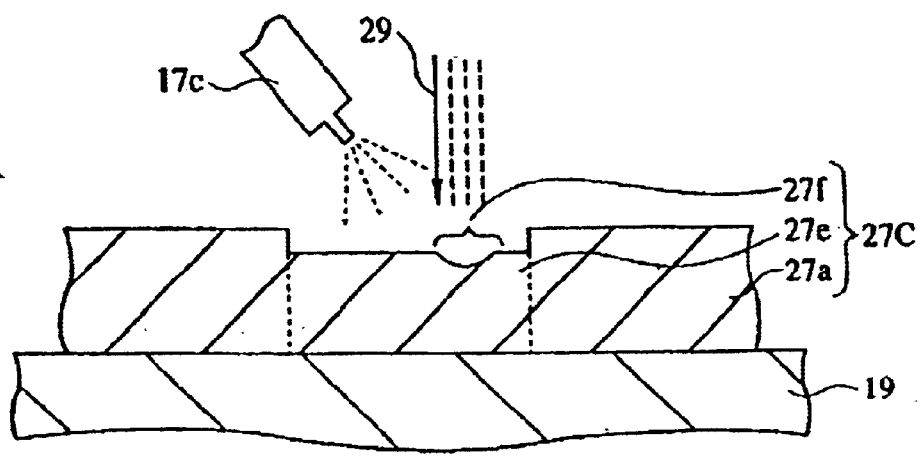
FIG. 3 is a view illustrating a second embodiment of a phase shift mask correction method.
Figure 3B:
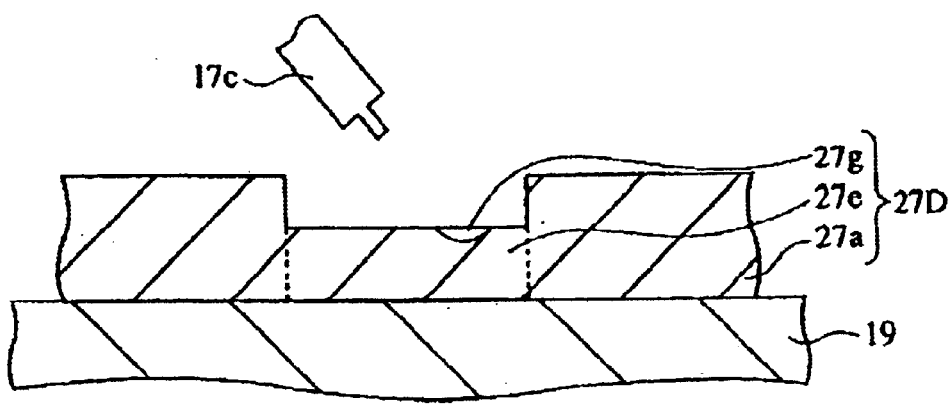

Correction processing of the phase shift mask 27C is realized (FIG. 3(A)) using the same procedure as described with reference to FIG. 2. A silicon family thin film 27g can then be deposited in the defect 27f using this correction processing (FIG. 3(B)). A phase shift mask 27D with the defect 27f corrected can also be obtained in this manner.

FIG. 4 is a view illustrating a third embodiment of a correction method. At a phase shift mask 27E where a shifter 27a is provided separately on a substrate 27a for phase shift mask use, an example is shown of correcting a phase shift mask 27E where the film thickness t1 of the shifter 27h is insufficient by an amount t from the film thickness required of the shifter. The film thickness required of the shifter is a film thickness for providing a prescribed phase difference (typically, a phase difference of 180 degrees) between the light passing through the shifter 27h and the light passing through the original light transmittance portion.

Figure 4A:
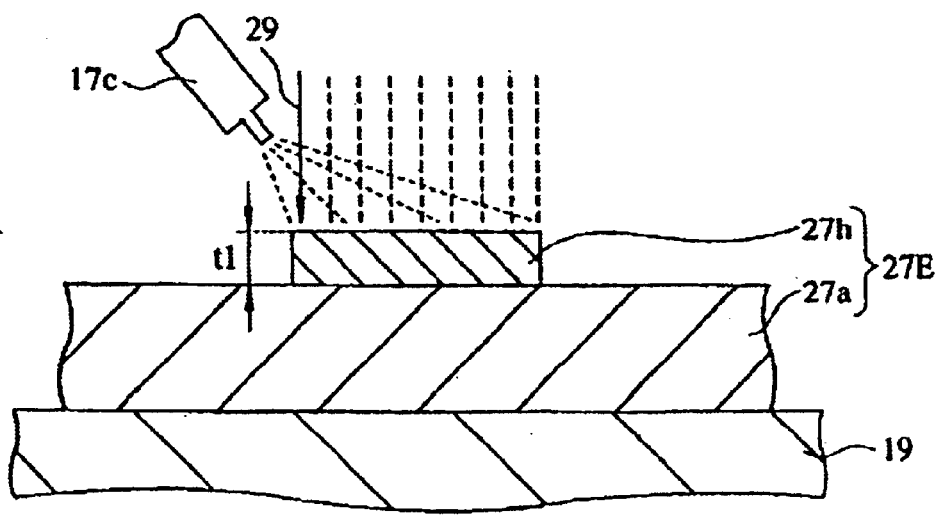
FIG. 4 is a view illustrating a third embodiment of a phase shift mask correction method.
Figure 4B:
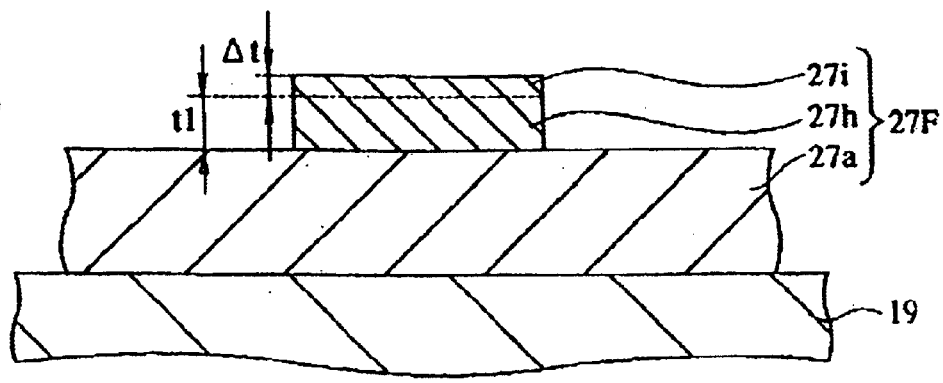

Correction processing of the phase shift mask 27E is realized (FIG. 4(A)) using the same procedure as described with reference to FIG. 2. As a result of the correction processing, a thin film of a silicon family thin film 27i corresponding to the film thickness t of the insufficient portion is deposited on the shifter 27h (FIG. 4(B)). As a result, a phase shift mask 27F with the defect corrected, i.e. with the insufficient film thickness corrected, is obtained.

In each of the correction processes described with reference to FIG. 2 to FIG. 4, a second gas is used together with the first gas. Carbon included in the first gas, etc. is therefore oxidized by the second gas before being evacuated to outside of the treatment room 11 by the evacuation unit 15. The silicon family thin film deposited on the shifter defect in any of the cases therefore has a lower carbon content than compared with the case where just a first gas is used as a gas. The shifter defect is therefore corrected to a thin film with a high transmittance of exposing light.

Halogen gas may also be supplied as the third gas together with the first and second gas during implementation of the phase shift mask correction method of this invention. As a result, redundant ions of the ions constituting the ion beam 29 that do not contribute to deposition of the thin film therefore react with halogens and are put into gaseous form. The redundant ions are then evacuated to outside of the treatment room 11 by the evacuation unit 15. Ions constituting the ion be am are therefore prevented from being included in the thin film deposited on the shifter defect and improvement of the transmittance of the thin film is achieved. It can be considered that these results are obtained regardless of the type of ions used.

When the third gas is used, the amount of third gas supplied is different depending on the ion beam dose and the acceleration speed, and it is preferable for this amount to be obtained through experiment, etc. It is preferable to decide the amount of third gas supplied in such a manner that the vacuum within the treatment room 11 that depends on the first gas, second gas and third gas can be maintained to such an extent that the operation of the ion beam is not hindered (this is by no means limiting, but to an extent that a high vacuum in excess of $5 \times 10^{-5}$ Torr is maintained).

It is also preferable to do the following when implementing the phase shift mask correction method of this invention. A description is given with regards to this with reference to FIG. 5.

Figure 5A:
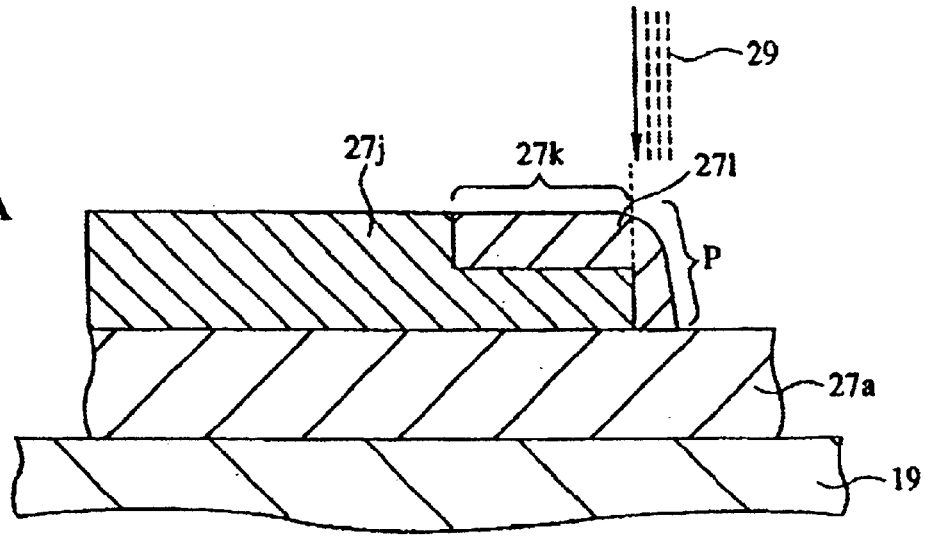
FIG. 5 is a view illustrating a fourth embodiment of a phase shift mask correction method.
Figure 5B:
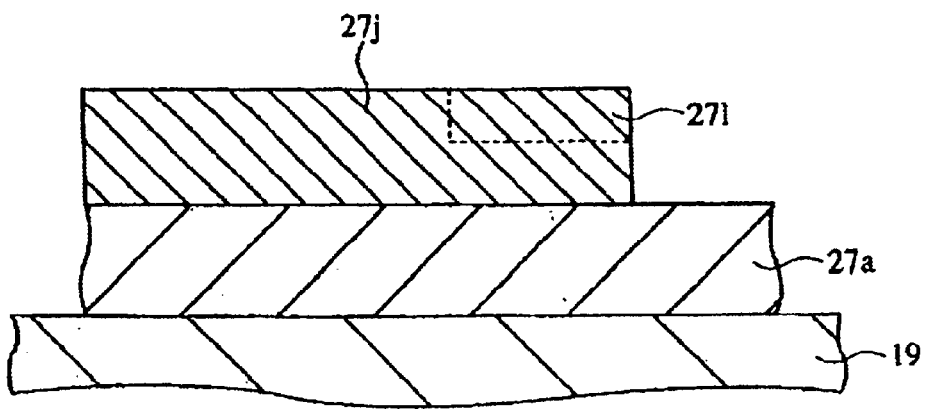

There are also many cases where an edge portion P of a thin film 271 deposited using gas and an ion beam at a defect (defective portion) 27k of the shifter 271 sags (FIG. 5(A)). Problems such as not being able to shift the exposing light to the desired phase angle and the shape of the edge pattern being detrimentally influenced occur when sagging occurs. The unnecessary portion P of this thin film 271 is then removed (by etching) using an ion beam 29 so as to match the contour of the shifter 27j. Correction to a shifter having an appropriate shape can then be achieved by this deletion (FIG. 5(B)).

This etching can be implemented using a function that the FIB apparatus 10 is given to begin with. Further, monitoring of whether or not the edge portion sags or monitoring of the portion being etched when etching of the sagging edge portion can be carried out by an image forming device that the FIB apparatus 10 possesses to begin with.

Processing of unnecessary portions may also be carried out using a laser beam in place of the ion beam 29. Processing using this laser beam may be carried out by a laser beam emitting device provided within the treatment room 11 or by a separately prepared laser beam emitting device.

A description is given in the above of an embodiment of this invention but this invention is by no means limited to the aforementioned embodiments and various modifications and alterations are possible.

For example, the arrangement of each structural component of the FIB apparatus is by no means limited to the example in FIG. 1. Further, the structure of each of the parts 11, 13 and 17 is by no means limited to the above example.

Further the applied example of the correction method is by no means limited to the above example and may also be applied to various types of phase shift masks.

INDUSTRIAL APPLICABILITY

As is dear from the above description, according to the method for correcting a phase shift mask of this invention, there is provided a method for correcting a phase shift mask, including a step of: irradiating an ion beam onto a defect of a phase shift mask having the defect at a shifter in a mixed gas atmosphere of a first gas for silicon family thin film forming and a second gas having oxidizability so as to deposit a silicon family thin film on the defect. Carbon which it is feared will be contained in the silicon family thin film is therefore oxidized and evacuated to outside in a gaseous form. The likelihood of carbon being contained in the thin film deposited on the defect portion of the shifter is therefore prevented or reduced. Shifter defects can therefore be corrected using thin films with a higher transmittance than those of the related art.

Further, according to the fib apparatus of this application, there is provided a prescribed treatment room, ion supplying unit, evacuation unit, gas supplying unit and control unit, and the method for correcting a phase shift mask of the present invention can therefore be implemented easily.

What is claimed is:

1. A method for repairing a phase shift mask, comprising the steps of: providing a phase shift mask having a substrate and a shifter disposed on the substrate; and irradiating an ion beam onto a defect of the shifter while supplying to a region of the shifter that includes the defect a first gas containing silicon, an oxidizing second gas, and a third gas for controlling an amount of ions from the ion beam which penetrate the region of the shifter to thereby form a silicon thin film on the defect and repair the phase shift mask.

2. A method according to claim 1; wherein the supplying step includes the step of supplying the second gas to provide an amount of oxygen for preventing the formation of carbon in the silicon thin film or reducing an extent to which carbon is contained in the silicon thin film.

3. A method according to claim 1; wherein the supplying step includes the step of supplying the second gas to provide an amount of oxygen so that a transmittance of the silicon thin film is the same as a transmittance of the shifter.

4. A method according to claim 1; wherein the supplying step includes the step of supplying the second gas to provide an amount of oxygen capable of preventing the formation of carbon in the silicon thin film or reducing an extent to which carbon is contained in the silicon thin film and so that a transmittance of the silicon thin film is the same as a transmittance of the shifter.

5. A method according to claim 1; wherein the supplying step includes the step of supplying the second gas to provide an amount of oxygen in excess of an amount of oxygen stoichiometrically required for forming the silicon thin film.

6. A method according to claim 1; wherein the first gas comprises a single type of gas or a mixture of two or more types of gases selected from a gas compound represented by the formula $(R-O_4)-Si$, where R represents an alkyl group.

7. A method according to claim 1; wherein the second gas comprises one or more types of gases selected from the group consisting of oxygen, ozone and water vapor.

8. A method according to claim 1; wherein the first gas comprises tetraethylorthosilicate (TEOS) and the second gas comprises a gas selected from the group consisting of oxygen, ozone and water vapor.

9. A method according to claim 1; wherein the ions of the ion beam comprise gallium ions.

10. A method according to claim 1; wherein the third gas comprises a gas selected from the group consisting of halogen gas, hydrogen gas, hydrogen halide gas and a gas of a substance including a halogen.

11. A method according to claim 1; further comprising the step of removing unnecessary portions of the silicon thin film using an ion beam or a laser beam in order to obtain alignment of the silicon thin film with an outline of the shifter.

12. A method according to claim 1; wherein the defect of the shifter comprises one of a defect in a portion of the shifter and a deficiency in a thickness of the shifter.

13. A focused ion beam apparatus comprising:
a treatment room for housing a phase shift mask having a shifter with a defect;
an ion beam supply unit for emitting an ion beam and directing the ion beam in the treatment room toward the phase shift mask;
an evacuation unit for evacuating the treatment room to provide therein a vacuum atmosphere;
a gas supply unit for supplying a first gas containing silicon, an oxidizing second gas, and a third gas into the treatment room; and
a control unit for controlling the evacuation unit to evacuate the treatment room and for controlling the ion beam supply unit to irradiate the ion beam onto the defect of the shifter while controlling the gas supply unit to supply the first gas, the oxidizing second gas, and the third gas to a region of the shifter including the defect to form a silicon thin film on the defect and thereby repair the phase shift mask, the third gas being selected for reducing an amount of ions from the ion beam which penetrate the region of the shifter.

14. A focused ion beam apparatus according to claim 13; wherein the control unit controls the gas supply unit to supply the second gas to provide an amount of oxygen for preventing the formation of carbon in the silicon thin film or reducing an extent to which carbon is contained in the silicon thin film.

15. A focused ion beam apparatus according to claim 13; wherein the control unit controls the gas supply unit to supply the second gas to provide an amount of oxygen so that a transmittance of the silicon thin film is the same as a transmittance of the shifter.

16. A focused ion beam apparatus according to claim 13; wherein the control unit controls the gas supply unit to supply the second gas to provide an amount of oxygen for preventing the formation of carbon in the silicon thin film is that same as or reducing an extent to which carbon is contained in the silicon thin film and so that a transmittance of the silicon thin film is the same as a transmittance of the shifter.

17. A focused ion beam apparatus according to claim 13; wherein the control unit controls the gas supply unit to supply the second gas to provide an amount of oxygen in excess of an amount of oxygen stoichiometrically required for forming the silicon thin film.

18. A focused ion beam apparatus according to claim 13; wherein the ions of the ion beam comprises gallium ions.

19. A method for repairing a phase shift mask, comprising the steps of:

providing a phase shift mask having a defect portion containing a defect;
disposing the phase shift mask in an atmosphere of a gas mixture comprised of a first gas containing silicon, an oxidizing second gas, and a third gas; and
irradiating an ion beam onto the defect portion of the phase shift mask to form a silicon thin film on the defect while the third gas controls an amount of ions from the ion beam which penetrates into the defect portion of the phase shift mask to thereby repair the phase shift mask.

20. A method according to claim 19; wherein the phase shift mask comprises a substrate and a shifter disposed on the substrate; and wherein the defect of the phase shift mask comprises a missing portion of the shifter.

21. A method according to claim 19; wherein the phase shift mask comprises a substrate and a shifter disposed on the substrate; and wherein the defect of the phase shift mask comprises an insufficient thickness of the shifter.

22. A method according to claim 19; wherein the second gas provides an amount of oxygen for preventing the formation of carbon in the silicon thin film or reducing an extent to which carbon is contained in the silicon thin film.

23. A method according to claim 19; wherein the second gas provides an amount of oxygen so that a transmittance of the silicon thin film is the same as a transmittance of the shifter.

24. A method according to claim 19; wherein the second gas provides an amount of oxygen capable of preventing the formation of carbon in the silicon thin film or reducing an extent to which carbon is contained in the silicon thin film and so that a transmittance of the silicon thin film is the same as a transmittance of the shifter.

25. A method according to claim 19; wherein the second gas provides an amount of oxygen in excess of an amount of oxygen stoichiometrically required for forming the silicon thin film.

26. A method according to claim 19; wherein the first gas comprises a single type of gas or a mixture of two or more types of gases selected from a gas compound represented by the formula $(R-O_4)-Si$, where R represents an alkyl group.

27. A method according to claim 19; wherein the second gas comprises one or more types of gases selected from the group consisting of oxygen, ozone and water vapor.

28. A method according to claim 19; wherein the first gas comprises tetraethylorthosilicate (TEOS) and the second gas comprises a gas selected from the group consisting of oxygen, ozone and water vapor.

29. A method according to claim 19; wherein the ions of the ion beam comprise gallium ions.

30. A method according to claim 19; wherein the third gas comprises a gas selected from the group consisting of halogen gas, hydrogen gas, hydrogen halide gas and a gas of a substance including a halogen.

* * * * *